(12) United States Patent
Grötsch et al.

(10) Patent No.: US 9,739,452 B2
(45) Date of Patent: Aug. 22, 2017

(54) METHOD OF PRODUCING A CONVERSION ELEMENT, AND CONVERSION ELEMENT

(71) Applicant: OSRAM Opto Semiconductors GmbH, Regensburg (DE)

(72) Inventors: Stefan Grötsch, Bad Abbach (DE); Michael Brandl, Mintraching (DE)

(73) Assignee: OSRAM Opto Semiconductors GmbH (DE)

( * ) Notice: Subject to any disclaimer, the term of this patent is extended or adjusted under 35 U.S.C. 154(b) by 6 days.

(21) Appl. No.: 14/782,673

(22) PCT Filed: Apr. 1, 2014

(86) PCT No.: PCT/EP2014/056505
§ 371 (c)(1),
(2) Date: Oct. 6, 2015

(87) PCT Pub. No.: WO2014/166778
PCT Pub. Date: Oct. 16, 2014

(65) Prior Publication Data
US 2016/0069539 A1  Mar. 10, 2016

(30) Foreign Application Priority Data
Apr. 8, 2013  (DE) .................. 10 2013 206 133

(51) Int. Cl.
| | | |
|---|---|---|
| B32B 3/00 | (2006.01) |
| F21V 13/08 | (2006.01) |
| H01L 33/60 | (2010.01) |
| H01L 33/50 | (2010.01) |
| H01L 33/64 | (2010.01) |
| F21Y 115/30 | (2016.01) |
| F21Y 115/10 | (2016.01) |
| F21Y 115/15 | (2016.01) |

(52) U.S. Cl.
CPC .............. *F21V 13/08* (2013.01); *H01L 33/60* (2013.01); *F21Y 2115/10* (2016.08); *F21Y 2115/15* (2016.08); *F21Y 2115/30* (2016.08); *H01L 33/507* (2013.01); *H01L 33/644* (2013.01); *H01L 2924/0002* (2013.01); *H01L 2933/0041* (2013.01); *H01L 2933/0058* (2013.01)

(58) Field of Classification Search
CPC ..... H01L 2933/0041; H01L 2933/0058; F21Y 2101/00; F21V 7/22; F21V 13/06
See application file for complete search history.

(56) References Cited

U.S. PATENT DOCUMENTS

| | | |
|---|---|---|
| 8,410,500 B2 | 4/2013 | Sormani et al. |
| 2011/0260178 A1 | 10/2011 | Bierhuizen |
| 2011/0309388 A1 | 12/2011 | Ito et al. |
| 2012/0235169 A1 | 9/2012 | Seko et al. |

FOREIGN PATENT DOCUMENTS

WO   2010/136920 A1   12/2010

*Primary Examiner* — Elizabeth Mulvaney
(74) *Attorney, Agent, or Firm* — DLA Piper LLP (US)

(57) ABSTRACT

A method of producing a conversion element includes providing a conversion body that converts electromagnetic radiation with regard to the wavelength thereof; applying an inorganic material to at least one portion of the conversion body; and forming a reflective layer that reflects the electromagnetic radiation and/or converted electromagnetic radiation with the inorganic material such that the inorganic material of the reflective layer enters into an adhesive connection with the conversion body.

14 Claims, 6 Drawing Sheets

METHOD OF PRODUCING A CONVERSION ELEMENT, AND CONVERSION ELEMENT

TECHNICAL FIELD

This disclosure relates to a method of producing a conversion element, and to a conversion element.

DE 10 2013 206 133.1, which expressly forms part of this disclosure, likewise describes a conversion element and a method of producing a conversion element.

BACKGROUND

Energy-efficient and high-intensity light sources such as LEDs (light emitting diode) or lasers, usually in the form of laser diodes, are increasingly being used in modern lighting devices. In contrast to incandescent bulbs, which are thermal emitters, those light sources emit light in a narrowly delimited spectral range such that their light is almost monochromatic or exactly monochromatic. One possibility for opening up further spectral ranges consists of light conversion, for example, wherein phosphors are irradiated by LEDs and/or laser diodes and in turn emit light having a different wavelength. In the so-called "remote phosphor" applications, for example, a layer comprising phosphor situated at a distance from a light source is usually illuminated by LEDs or laser diodes and in turn emits light having a different color, i.e., a different wavelength. Applications are also known, however, wherein the layer comprising the phosphor is arranged directly on the light source. By way of example, those techniques can be used to convert light from blue LEDs into white light by admixing yellow light generated by the excitation of a phosphor-containing layer. The layer can be, for example, in the form of a solid body, for example, in the form of a lamina.

In the abovementioned applications, the phosphors are usually excited to emission by LEDs and/or laser diodes having high light powers. Thermal losses that arise in the process have to be dissipated, for example, via the carrier to avoid overheating and thus thermally governed changes in the optical properties or even the destruction of the phosphor.

The phosphors, usually present in pulverulent form, without an additional use of binders, for example, silicones, do not form mechanically stable layers, i.e., abrasion- and/or stretch-resistant layers. However, binders are also generally used to unite the phosphor particles into one phase, which can then be applied to corresponding surfaces. When binders are used for layer stabilization, however, the binders themselves can interact with the phosphors and thus adversely influence their optical and thermal properties, and their lifetime. Furthermore, thermal conductivity of the binders is often a limiting variable in the dissipation of heat that arises in the conversion element.

Conversion elements formed from a ceramic comprising the phosphor or from a crystal comprising the phosphor are known as alternatives. More particularly, the phosphor can form the ceramic or the crystal. Such conversion elements can be fixedly adhesively bonded to heat sinks so that the heat arising therein can be dissipated. In that case, a limiting variable for the heat dissipation is the thermal conductivity of the adhesive used. Therefore, the conversion elements can also be arranged directly, in particular without adhesive therebetween, on the light emitting component, for example, the LED chip. Furthermore, it is beneficial to good heat dissipation if the conversion elements are made particularly thin.

The phosphor is embedded in the ceramic or incorporated in the crystal structure and in various examples can be a phosphor mixture comprising a mixture of different phosphors as a result of which, for example, light combining a plurality of different colors can be generated. Suitable phosphors are known.

It is known, for the purpose of increasing efficiency of a light emitting assembly comprising a light emitting component and a conversion element, and/or for the purpose of increasing a luminance of light generated by the light emitting assembly, to embed the conversion element into silicone such that side walls of the conversion element running, for example, substantially parallel to a main emission direction of the emitted light are in physical contact with the silicone, and sides of the conversion element running perpendicularly to the main emission direction are substantially free of silicone. By way of example, the conversion element can be encapsulated with the silicone by molding. Titanium oxide, for example, which reflects the light, can be embedded into the silicone. The silicone is relatively sensitive and can easily be damaged and is therefore regularly made particularly large and/or thick, and so the size of the conversion element comprising the silicone significantly increases, for example, doubles, compared to the same conversion element without the silicone.

SUMMARY

We provide a method of producing a conversion element including providing a conversion body that converts electromagnetic radiation with regard to the wavelength thereof; applying an inorganic material to at least one portion of the conversion body; and forming a reflective layer that reflects the electromagnetic radiation and/or converted electromagnetic radiation with the inorganic material such that the inorganic material of the reflective layer enters into an adhesive connection with the conversion body.

We also provide a conversion element including a conversion body that converts electromagnetic radiation with regard to the wavelength thereof; and a reflective layer applied to at least one portion of the conversion body adhesively connects to the conversion body and includes an inorganic material.

We further provide a method of producing a conversion element including providing a conversion body for converting electromagnetic radiation with regard to the wavelength thereof; applying inorganic material to at least one portion of the conversion body by a liquid that includes the inorganic material being applied to at least the portion of the conversion body; heating the conversion body with the liquid adhering to it such that the inorganic material melts and enters into an adhesive connection with the conversion body; and cooling the conversion body with the inorganic material, wherein the inorganic material hardens during cooling and forms a reflective layer that reflects the electromagnetic radiation and/or converted electromagnetic radiation.

DETAILED DESCRIPTION

Figure 1:
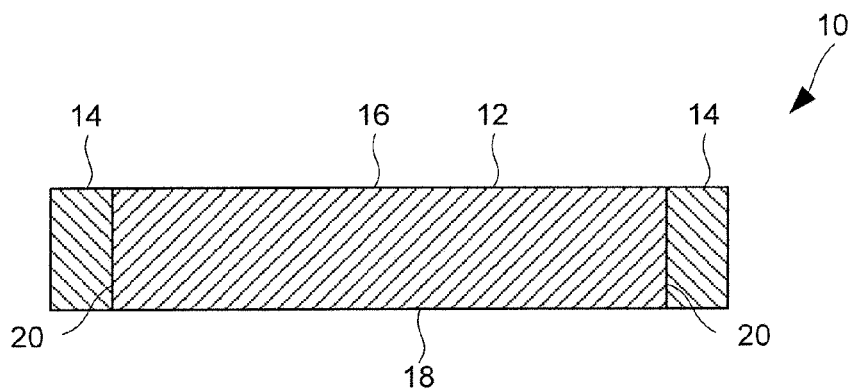
FIG. 1 shows a sectional illustration of one example of a conversion element.

We provide a method of producing a conversion element which makes it possible in a simple manner for the conversion element to have high efficiency during the light conversion and/or for the electromagnetic radiation provided by the conversion element to have a high luminance and/or for the conversion element to be stable and/or for the conversion element to be relatively small, for example, smaller than a conventional conversion element having high efficiency.

We also provide a conversion element having a high efficiency during the light conversion and/or by which electromagnetic radiation provided has a high luminance and/or which is relatively small, for example, smaller than a conventional conversion element having high efficiency.

We further provide a method of producing a conversion element. In this case, a conversion body that converts electromagnetic radiation with regard to the wavelength thereof is provided. An inorganic material is applied to at least one portion of the conversion body. By the inorganic material a reflective layer that reflects the electromagnetic radiation is formed such that the inorganic material of the reflective layer enters into an adhesive connection with the conversion body.

The reflective layer comprising the inorganic material can be, for example, relatively hard, for example, harder than the silicone used in a conventional conversion element. This can contribute to the conversion element being particularly stable. At the same time, on account of the reflective property of the layer, the conversion element has a high efficiency and makes it possible to provide electromagnetic radiation having a high luminance, wherein non-converted electromagnetic radiation can first be provided by an electromagnetic radiation emitting component, which radiation can then be wholly or partly converted into converted electromagnetic radiation by the conversion element. The conversion element and the electromagnetic radiation emitting component can form an electromagnetic radiation emitting assembly. The reflective layer can comprise or be formed from, for example, an inorganic, for example, metal-free material. The inorganic material of the conversion body can comprise or be formed from, for example, ceramic, crystal, enamel or glass.

The conversion body can comprise, for example, an inorganic, for example, metal-free material. The inorganic material of the conversion body can comprise or be formed from, for example, ceramic, crystal or glass. The conversion body can be provided, for example, as a green body. The conversion body can consist, for example, completely or only partly of ceramic, crystal or glass. Furthermore, for example, the crystal conversion body can be a single crystal. Independently thereof, the conversion body can comprise a matrix material which can comprise diamond or $Al_2O_3$, for example. The fact that the conversion body is provided can mean, for example, that the conversion body is formed.

The conversion body comprises at least one phosphor embedded into the conversion body or by which the conversion body is formed. The phosphor can be part of a phosphor mixture comprising a mixture of different phosphors, as a result of which, for example, light which combines a plurality of different colors can be generated.

The fact that the conversion body enters into an adhesive connection with the inorganic material can mean, for example, that the conversion body and the inorganic material connect by atomic and/or molecular forces. The adhesive connection can be a connection that is not nondestructively releasable.

Phosphor can be understood to mean a substance which converts, in a manner exhibiting losses, electromagnetic radiation having one wavelength into electromagnetic radiation having a different wavelength, for example, a longer wavelength (Stokes shift) or a shorter wavelength (anti-Stokes shift), for example, by phosphorescence or fluorescence. The energy difference between absorbed electromagnetic radiation and emitted electromagnetic radiation can be converted into phonons, i.e., heat, and/or by emission of electromagnetic radiation having a wavelength as a function of the energy difference.

The inorganic material may be applied to the conversion body by a liquid comprising the inorganic material being applied to at least the portion of the conversion body. The conversion body with the liquid adhering to it is heated such that the inorganic material melts and enters into an adhesive connection with the conversion body. The conversion body with the inorganic material is cooled, wherein the inorganic material hardens during cooling and forms a reflective layer that reflects the electromagnetic radiation.

The liquid can comprise, for example, a ceramic slip, a glass melt or an enamel slip. The ceramic slip can comprise, for example, ceramic powder and water. The liquid can comprise, for example, a suspension of the inorganic material (frits, powder dissolved in water) in water. The enamel slip can comprise, for example, an enamel frit and water. If the conversion body comprises ceramic and is a green body, then the green (unfired) conversion body can first be subjected to biscuit firing. The firing temperature during biscuit firing is lower than during glost firing after the enamel slip has been applied. After biscuit firing, the liquid comprising the inorganic material is poured over the conversion body, or the latter is dipped into the liquid or the latter is brushed on the conversion body. During glost firing, the inorganic material melts and its constituents adhesively combine with one another and with the conversion body.

The enamel is a mass having an inorganic composition, usually consisting of silicates and oxides, which is usually produced in vitreously solidified form by melting or fitting, which means a melting process terminated shortly before completion. This mass, sometimes with additives, is generally applied to the conversion body in one or a plurality of layers and is melted at high temperatures and with a short firing duration.

The liquid may be dried after being applied to the conversion body and before heating. The conversion body with the liquid can be dried, for example, by moderate heating. In this case, the inorganic material on the conversion body can undergo transition to a powderlike state. When an enamel frit is used, the powder layer can also be referred to as an enamel biscuit.

The conversion body may have a first side and a second side facing away from the first side. The conversion body has between the first side and the second side side walls that connect the first side and the second side. The inorganic material is applied to at least one of the side walls. For the purpose of converting the electromagnetic radiation, the electromagnetic radiation can be coupled into the first side, for example, and the converted electromagnetic radiation can be coupled out at the second side. The side walls coated with the inorganic material can then reflect the electromagnetic radiation and/or the converted electromagnetic radiation.

The inorganic material can be applied, for example, to the side wall by the liquid being spread over the corresponding side wall. As an alternative thereto, the side wall to be coated can be dipped into the liquid. The inorganic material can be applied to all the side walls, for example. The side wall to which the inorganic material is applied can be covered, for example, completely by the inorganic material. This contributes to the fact that as much as possible of the electromagnetic radiation which impinges on the corresponding side wall is reflected. By way of example, converted and/or non-converted electromagnetic radiation can be reflected in a direction out of the conversion element. Furthermore, non-converted electromagnetic radiation can be reflected back into the conversion body and converted there as a result of which efficiency of the conversion element and the electromagnetic radiation emitting assembly is increased.

The conversion body may be clamped in between a first holding body and a second holding body such that the first side of the conversion body is in physical contact with the first holding body and the second side of the conversion body is in physical contact with the second holding body. For the purpose of applying the inorganic material to the side walls of the conversion body, the liquid is introduced between the two holding bodies. The holding bodies can be deformable, for example, at their contact areas at which they come into direct physical contact with the conversion body. That can mean, for example, that the holding bodies deform at least slightly when holding the conversion body at the contact areas. This can contribute to the fact that no liquid reaches the first side and/or second side of the conversion body. This makes it possible, when the conversion element is used in an electromagnetic radiation emitting assembly, for the electromagnetic radiation that is to be converted to be coupled into the conversion body on the second side and for the non-converted and/or the converted electromagnetic radiation to be coupled out from the conversion body on the first side. The holding bodies can comprise, for example, rubber, wax or silicone at their contact areas. Furthermore, a plurality of conversion elements can be held by the holding bodies and provided with the liquid simultaneously. Furthermore, the conversion body or conversion bodies can also be held by the holding bodies during subsequent firing or sintering.

The inorganic material may be applied to the entire conversion body. The inorganic material is at least partly removed from the conversion body after the adhesive connection to the conversion body. By way of example, the inorganic material can be applied to the entire conversion body by the conversion body being dipped into the liquid. By way of example, the inorganic material can be partly or completely removed from the first and/or second side of the conversion body. The inorganic material can be removed, for example, by milling, scratching, grinding, a laser, sandblasting, water jetting or dry etching.

The inorganic material may be removed at least partly from the first side of the conversion body and at least partly from the second side of the conversion body. This makes it possible, when the conversion element is used in an electromagnetic radiation emitting assembly, for the electromagnetic radiation to be converted to be coupled into the conversion body on the second side and the non-converted and/or the converted electromagnetic radiation to be coupled out from the conversion body on the first side.

Before the process of applying the inorganic material, the first side and the second side of the conversion body may be at least partly coated with a masking material. The masking material can cover, for example, the entire first and/or the entire second side of the conversion body. The masking material can comprise, for example, wax, photoresist and/or an adhesion medium, for example, adhesive.

The inorganic material may be applied to the conversion body and the masking material. The masking material and the inorganic material applied thereto are removed during the process of heating the conversion body. By way of example, the masking material below the inorganic material can evaporate and then blast away the inorganic material above the masking material on account of the pressure that arises.

During the process of applying the inorganic material, the masking material may remain free of inorganic material. The masking material is removed during the process of heating the conversion body. By way of example, the masking material can be chosen such that the inorganic material and/or the liquid do/does not adhere to the masking material and/or that the liquid does not wet the masking material. Generally, wetting is a behavior of liquids in contact with the surface of solids. Wettability is the associated property. Depending on what liquid is involved, what material the surface consists of and what the constitution thereof is, for example, with regard to the roughness and/or the material, the liquid wets the surface to a greater or lesser extent. Wettability is dependent on the ratios of the surface tensions involved, which are related to the contact angle by Young's equation and thus make the contact angle the measure of wettability. In this case, the greater the contact angle, the lower the wettability. Specifically, the surface tensions between the liquid and the masking material primarily play a part in the measure of wettability.

A coupling layer comprising metal may be formed on the reflective layer. The coupling layer can be, for example, a metal layer and/or a solder layer. The coupling layer can serve, for example, to thermally and/or mechanically couple the conversion element to a carrier, for example, a housing or a printed circuit board.

A conversion element may be provided. The conversion element comprises the conversion body that converts electromagnetic radiation with regard to the wavelength thereof. The reflective layer is applied to at least one portion of the conversion body. The reflective layer adhesively connects to the conversion body and comprises the inorganic material.

The inorganic material may be metal-free. In other words, the inorganic material comprises no metal.

The inorganic material may comprise ceramic, glass and/or enamel.

The conversion body may have the first side and the second side facing away from the first side. The conversion body has between the first side and the second side side walls that connect the first side and the second side. The inorganic material is applied to at least one portion of the side walls.

The side walls may be covered with the inorganic material.

The coupling layer comprising metal may be formed on the reflective layer.

Examples are illustrated in the figures and are explained in greater detail below.

In the following detailed description, reference is made to the accompanying drawings, which form part of this description and show for illustration purposes specific examples. In this regard, direction terminology such as, for instance, "at the top," "at the bottom," "at the front," "at the back," "front," "rear" and the like is used with respect to the orientation of the figure(s) described. Since component parts of examples can be positioned in a number of different orientations, the direction terminology serves for illustration and is not restrictive in any way whatsoever. Other examples can be used and structural or logical changes can be made without departing from the scope of protection. The features of the various examples described herein can be combined with one another, unless specifically indicated otherwise. Therefore, the following detailed description should not be interpreted in a restrictive sense, and the scope of protection of this disclosure is defined by the appended claims.

The terms "connected" and "coupled" are used to describe both a direct and an indirect connection and a direct or indirect coupling. In the figures, identical or similar elements are provided with identical reference signs, insofar as this is expedient.

An electromagnetic radiation emitting assembly can comprise, for example, one, two or more electromagnetic radiation emitting components and one, two or more conversion elements.

An electromagnetic radiation emitting component can be an electromagnetic radiation emitting semiconductor component and/or can be an electromagnetic radiation emitting diode, an organic electromagnetic radiation emitting diode, a laser radiation emitting laser diode, an electromagnetic radiation emitting transistor or an organic electromagnetic radiation emitting transistor. The radiation can be, for example, light in the visible range, UV light and/or infrared light. In this connection, the electromagnetic radiation emitting component can be, for example, a light emitting diode (LED), an organic light emitting diode (OLED), a light emitting transistor or an organic light emitting transistor. The light emitting component can be part of an integrated circuit. Furthermore, a plurality of light emitting components can be provided, for example, in a manner accommodated in a common housing. Furthermore, the electromagnetic radiation emitting component can be a laser and the electromagnetic radiation can be laser radiation.

The conversion element or the conversion elements can comprise, for example, one, two or more phosphors, for example, a phosphor mixture and/or a carrier body into which the phosphors are embedded, wherein the carrier body can comprise ceramic, glass or crystal.

Customary phosphors are, for example, garnets or nitrides silicates, nitrides, oxides, phosphates, borates, oxynitrides, sulphides, selenides, aluminates, tungstates and halides of aluminum, silicon, magnesium, calcium, barium, strontium, zinc, cadmium, manganese, indium, tungsten and other transition metals, or rare earth metals such as yttrium, gadolinium or lanthanum, which are doped with an activator such as, for example, copper, silver, aluminum, manganese, zinc, tin, lead, cerium, terbium, titanium, antimony or europium. The phosphor may be an oxidic or (oxy)nitridic phosphor such as a garnet, orthosilicate, nitrido(alumo)silicate, nitride or nitridoorthosilicate, or a halide or halophosphate. Specific examples of suitable phosphors are strontium chloroapatite:Eu (($Sr,Ca)_5(PO_4)_3Cl$:Eu; SCAP), yttrium aluminum garnet:cerium (YAG:Ce) or $CaAlSiN_3$:Eu. Furthermore, the phosphor or phosphor mixture can contain, for example, particles having light scattering properties and/or auxiliaries. Examples of auxiliaries include surfactants and organic solvents. Examples of light scattering particles are gold, silver and metal oxide particles.

FIG. 1 shows a sectional illustration of one example of a conversion element 10. The conversion element 10 comprises a conversion body 12 and a reflective layer 14.

The conversion body 12 can comprise, for example, ceramic, crystal and/or glass. The conversion body 12 comprises one, two or more phosphors embedded in the material of the conversion body 12. The conversion body 12 is suitable for converting electromagnetic radiation with regard to the wavelength thereof by the phosphors embedded into it.

The conversion body 12 has a first side 16 and a second side 18 facing away from the first side 16. The conversion body 12 furthermore has side walls 20 that are arranged between the first side 16 and the second side 18 and connect the first side 16 and the second side 18. When the conversion body 12 is used to convert electromagnetic radiation, for example, the second side 18 of the conversion body 12 can couple the electromagnetic radiation into the conversion body 12 and the first side 16 can couple out the converted electromagnetic radiation and/or the non-converted electromagnetic radiation.

The conversion body 12 is rectangular. The conversion body 12 is furthermore flat, that is to say that the areas of the first side 16 and of the second side 18 are significantly larger than the areas of the side walls 20. The side walls 20 and the two sides 16, 18 are planar. The conversion body 12 is a lamina, for example. As an alternative thereto, the conversion body 12 can be substantially cubic, trapezoidal, wedge-shaped, for example, and/or can have roundish, for example, convex or concave side walls 20 and/or can have relatively small cutouts at one or more outer edges, for example, for electrical contacting. The relatively small cutouts can, for example, fit a bonding wire to the light emitting component, for example, below the conversion body 12 and/or can be polygonal and/or roundish. By way of example, the light emitting component can be exposed below the conversion body 12 in the cutout.

The reflective layer 14 comprises an inorganic material and adhesively connect to the conversion body 12. The reflective layer 14 can, for example, completely cover the side walls 20. The first side 16 and the second side 18 are free of the reflective layer 14. As an alternative thereto, however, the reflective layer 14 can cover only a portion of the side walls 20 and/or partly cover the first side 16 and/or the second side 18. The reflective layer 14 is shown relatively thick for reasons of enabling better illustration. However, the reflective layer 14 can also be made significantly thinner. The reflective layer 14 can be relatively hard, stable and/or durable, for example, impact-resistant. The fact that the reflective layer 14 is reflective can mean, for example, that 70% to 100%, for example, 90% to 99%, for example, 95% to 98% of the electromagnetic radiation to be converted or converted electromagnetic radiation impinging on it can be reflected by it.

The inorganic material can, for example, be metal-free and/or comprise ceramic, for example, ceramic frit, glass, for example, glass solder, enamel, for example, enamel frit, and/or titanium oxide. The fact that the conversion body 12 adhesively connects to the reflective layer 14, in particular to the inorganic material, can mean, for example, that the conversion body 12 and the inorganic material connect by atomic and/or molecular forces. The adhesive connection can be a connection that is not nondestructively releasable. By way of example, the reflective layer 14 can be baked with the conversion body 12, which can mean, for example, that the inorganic material and the conversion body 12 were baked at high temperatures and entered into the adhesive connection in the process.

Figure 2:
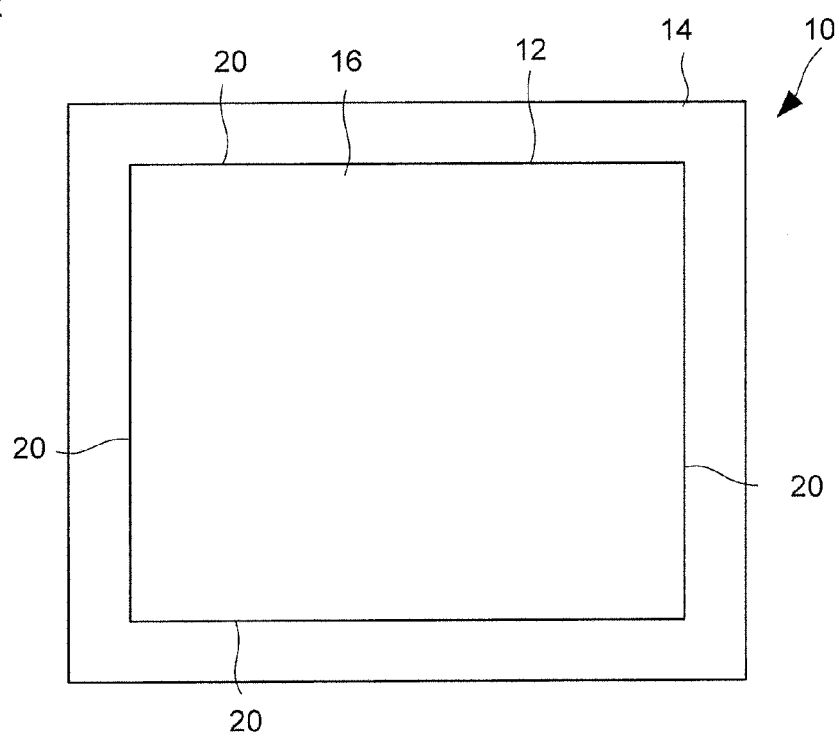
FIG. 2 shows a plan view of one example of a conversion element.

FIG. 2 shows a plan view of one examples of a conversion element 10 which can, for example, largely correspond to the conversion element 10 explained above. The conversion element 10 has the reflective layer 14 on all four side walls 20. The first side 16 of the conversion body 12 is free of the reflective layer 14.

As an alternative thereto, only a portion of the side walls 20 can be coated with the reflective layer 14. By way of example, only one, two or three of the side walls 20 can be coated with the reflective layer 14. Alternatively or additionally, a portion of the first side 16 of the conversion body 12 can be coated with the reflective layer 14.

The conversion element 10 has a rectangular structure in plan view. As an alternative thereto, the conversion element 10 can be triangular, pentagonal or many-sided, in particular polygonal, or roundish, for example, circular or oval, in plan view. Furthermore, the conversion element 10 can, for example, be substantially polygonal, but have rounded and/or chamfered corners.

Figure 3:
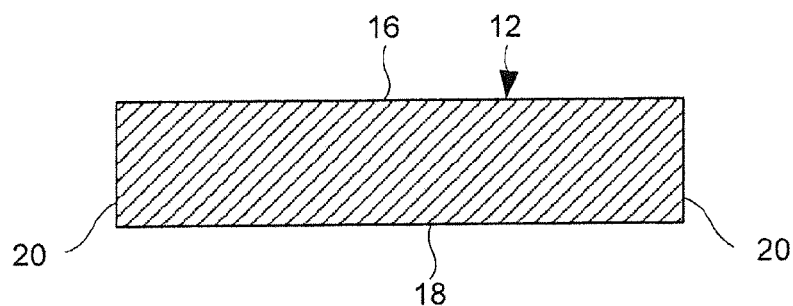
FIG. 3 shows one example of a conversion body.

FIG. 3 shows one example of a conversion body 12 which can, for example, largely correspond to one of the conversion bodies 12 explained above. FIG. 3 shows the conversion body 12 during a method of producing a conversion element 10, for example, the conversion element 10 explained above. In this state, the conversion body 12 is finished and is thus provided as a basis for the conversion element 10. The conversion body 12 can be stamped from a blank, for example.

If the conversion body 12 comprises or is formed from ceramic, the conversion body 12 can be provided as a green body or can already be ready baked or fired. In ceramics, green body denotes an unfired blank that can still be processed. By way of example, this involves pressed ceramic powder, powder bonded with binders by slip casting, or synthetic resins which carbonize to form carbon during firing.

Figure 4:
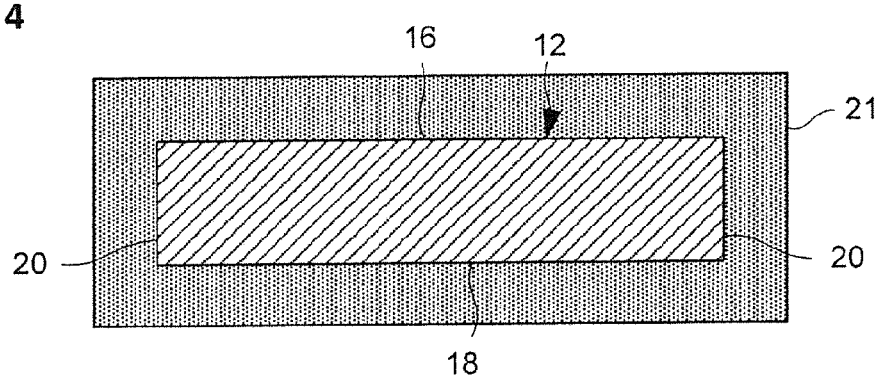
FIG. 4 shows one example of a conversion body with a coating.

FIG. 4 shows the conversion body 12 in accordance with FIG. 3 in a state during the method of producing the conversion element 10 in which the entire conversion body 12 is coated with a coating 21. The coating 21 comprises a liquid, for example, a viscous liquid and/or suspension which comprises the inorganic material. By way of example, the liquid can comprise a ceramic slip, a glass melt or an enamel slip. The ceramic slip can comprise ceramic powder and water, for example. The liquid can comprise, for example, a suspension of the inorganic material, for example, of the frits, in particular of the glass frits or of the enamel frits or powder dissolved in water, and water. The coating 21 serves as a basis to form the reflective layer 14. The coating 21 on the conversion body 12 can be non-reflective, for example.

The coating 21 can be applied to the conversion body 12, for example, by the conversion body 12 being dipped into the liquid, which then adheres to the conversion body 12. By way of example, the entire conversion body 12 can be dipped into a bath of the liquid such that the coating covers the entire conversion body 12. As an alternative thereto, only a portion of the conversion body 12 can be dipped into the bath such that only a corresponding partial region of the conversion body 12 is covered with the coating 21. Furthermore, alternatively, the coating 21 can be applied by the liquid being completely or partly spread over the conversion body 12. The coating 21 is shown relatively thick for reasons of enabling better illustration. However, the coating 21 can also be made significantly thinner.

The coating 21 on the conversion body 12 and in particular the liquid can optionally be dried at moderate temperatures, for example, at a temperature of 50° to 150°, for example, 80° to 120°, for example, at approximately 100°.

The conversion body 12 with the coating 21, in particular the liquid and the inorganic material arranged therein, can then be fired and/or sintered at high temperatures, for example, at a temperature of 350° to 1200°, for example, 700° to 1000° degrees, for example, 800° to 950°. During firing, the inorganic material melts and enters into the adhesive connection with the material of the conversion body 12. In other words, the reflective layer 14 is baked with the conversion body 12. After firing, the inorganic material on the conversion body 12 forms the reflective layer 14.

As an alternative thereto, the firing can also be divided into biscuit firing and glost firing. By way of example, the conversion body 12 can be a green body and the uncoated green body can first be subjected to the biscuit firing. The firing temperature is lower than during glost firing after application of the enamel slip. After the biscuit firing, the conversion body 12 is coated with the liquid comprising the inorganic material. By way of example, the liquid is poured on the conversion body, the latter is dipped into the liquid or the latter is brushed over the conversion body. During the subsequent glost firing, the inorganic material melts and its constituents combine adhesively with one another and with the conversion body 12 and form the reflective layer 14 adhesively connected to the conversion body 12.

Figure 5:
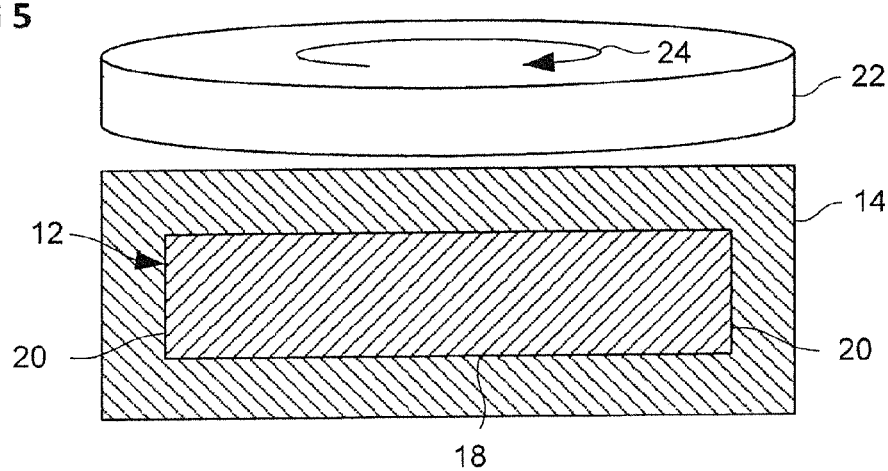
FIG. 5 shows the conversion body in accordance with FIG. 4 and a mechanical processing tool.

FIG. 5 shows the conversion body 12 in accordance with FIG. 4 with the reflective layer 14 after firing, for example, after glost firing. In addition, FIG. 5 shows one example of a mechanical tool that mechanically removes the reflective layer 14, for example, from the first side 16 and/or the second side 18 of the conversion body 12. The tool 22 is, for example, a rotating grinding or polishing disk which can be used to remove the reflective layer 14 on the first side 16. As an alternative thereto, however, the tool 22 can also be some other tool that mechanically removes the reflective layer, for example, a linearly moving grinding tool, a scratching tool or a scraping tool. Furthermore, the reflective layer 14 on the first and/or second side 16, 18 can be removed by sandblasting and/or water jetting.

Figure 6:
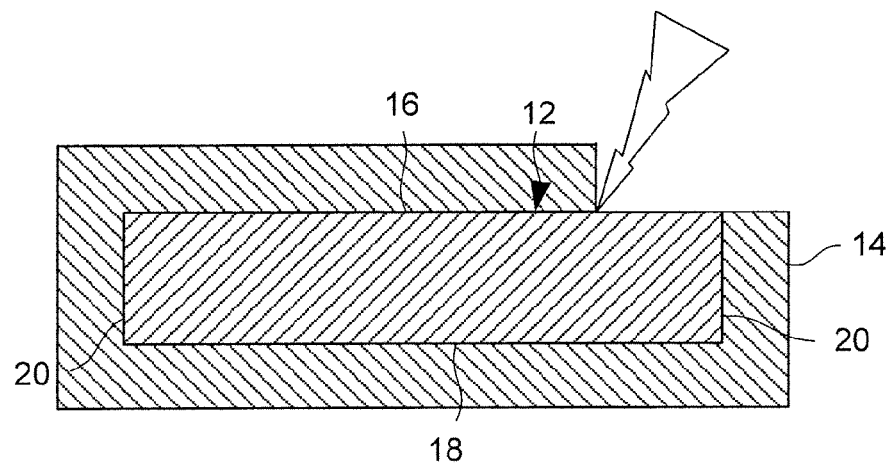
FIG. 6 shows the conversion body in accordance with FIG. 4 and electromagnetic radiation.

FIG. 6 shows the conversion body 12 in accordance with FIG. 4 after firing with the reflective layer 14 and, indicated schematically, electromagnetic processing radiation 25, for example, a laser beam by which the reflective layer 14 can be removed from the first side 16 and/or the second side 18 of the conversion body 12. The laser that generates the electromagnetic processing radiation 25 can be a $CO_2$ laser, for example, which generates laser radiation having a relatively long wavelength.

Figure 7:
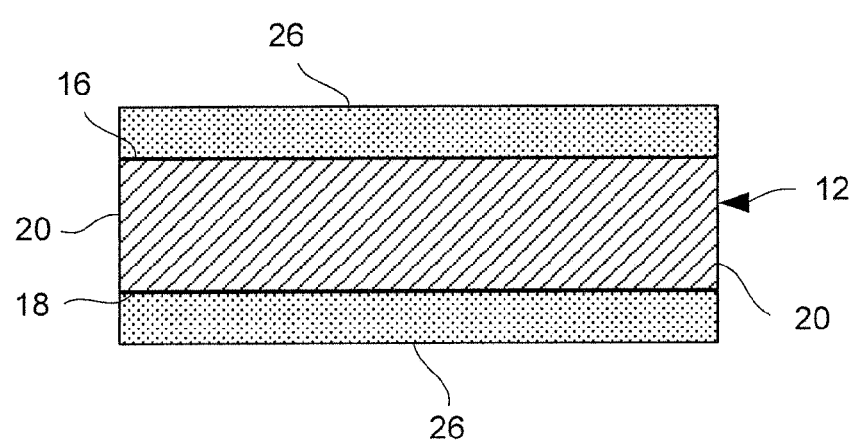
FIG. 7 shows the conversion body in accordance with FIG. 3 with masking material.

FIG. 7 shows the conversion body 12 in accordance with FIG. 3 before application of the coating 21. A masking material 26 is applied on the first side 16 and on the second side 18. In particular, a first masking layer is applied on the first side 16 and a second masking layer 18 is applied on the second side 18. The first masking layer completely covers the first side 16 and/or the second masking layer completely covers the second side 18. As an alternative thereto, the masking layers can only partly cover the corresponding sides 16, 18.

The masking material 26 can comprise, for example, wax, photoresist or an adhesion medium, for example, adhesive. The masking material 26 can be, for example, not wetted by the liquid and/or that the liquid does not adhere thereto and/or that it melts and/or evaporates during the firing and/or sintering of the conversion body 12 and the liquid.

If the liquid does not wet the masking material and/or does not adhere thereto, then the conversion body 12 can simply be dipped into the liquid. The liquid then adheres exclusively to the side walls 20 and forms the coating 21 exclusively on the side walls. The conversion body 12 can then be fired in a manner partly coated in this way. The masking material 26 melts and/or evaporates during firing such that the first side 16 and the second side 18 are exposed and the coating 21 on the side walls 20 forms the reflective layer 14.

Figure 8:
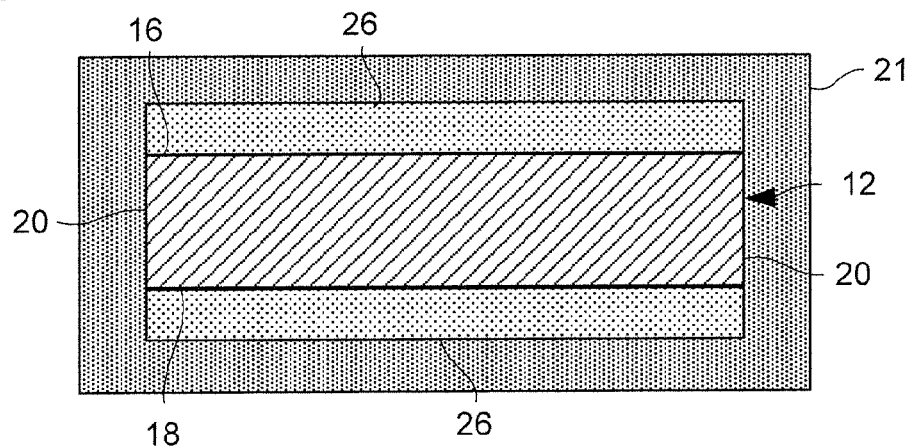
FIG. 8 shows the conversion body in accordance with FIG. 7 with a coating.

FIG. 8 shows the conversion body 12 with the masking material 26 in accordance with FIG. 7 in which the liquid also wets the masking material 26 and/or adheres thereto. The coating 21 is shown relatively thick to enables better illustration. However, the coating 21 can also be made significantly thinner. During firing, the masking material 26 below the coating 21 or the reflective layer 14 burns and/or evaporates, as a result of which the reflective layer 14 above the masking material 26 is destroyed, for example, blasted away, as a result of which the first side 16 and the second side 18 are exposed.

Figure 9:
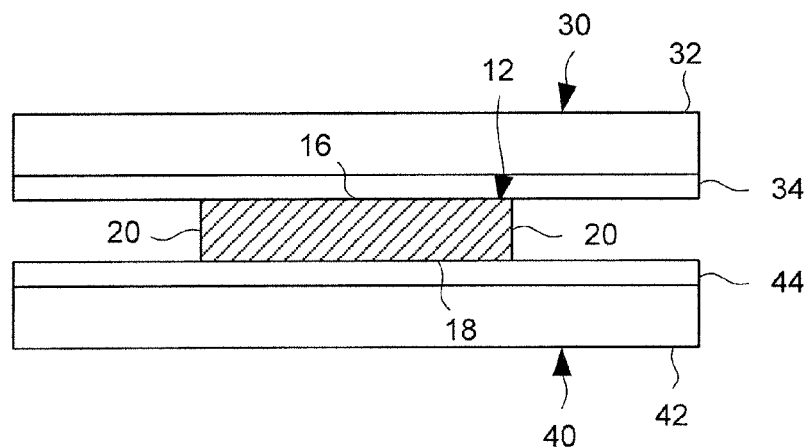
FIG. 9 shows the conversion body in accordance with FIG. 3 and two holding bodies.

FIG. 9 shows the conversion element 12 in accordance with FIG. 3, wherein the conversion body 12 is clamped in between a first holding body 30 and a second holding body 40. The first holding body 30 comprises a first holding plate 32 and a flexible first layer 34. The second holding body 40 comprises a second holding plate 42 and a second flexible layer 44. The first side 16 is in direct physical contact with the first flexible layer 34. The second side 18 is in direct physical contact with the second flexible layer 44. The flexible layers 34, 44 can comprise or be formed from, for example, wax, rubber and/or adhesive films. The two holding bodies 30, 40 are pressed together such that the conversion body 12 at least slightly deforms the two flexible layers 34, 44. This has the effect that at least the first side 16 and the second side 18 of the conversion body 12 are completely covered with the material of the flexible layers 34, 44 and are sealed in a liquid-tight manner. As an alternative thereto, the flexible layers 34, 44 can be dispensed with and the conversion body 12 can be directly coupled to the holding plates 32, 42.

Figure 10:
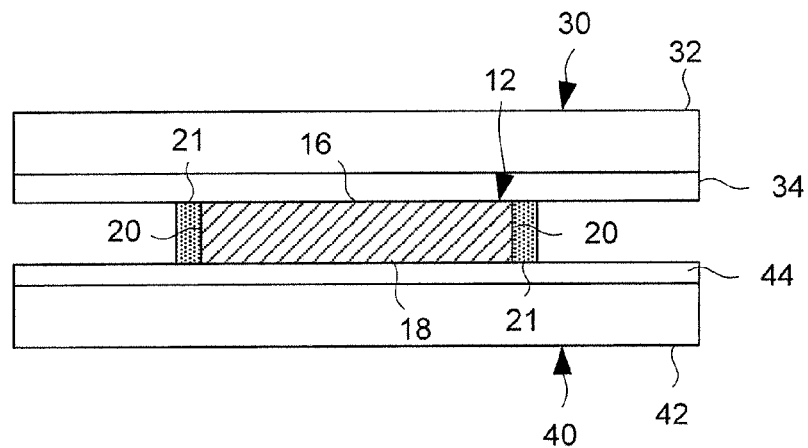
FIG. 10 shows the conversion body and the holding bodies in accordance with FIG. 9, with a coating on the conversion body.

FIG. 10 shows the conversion body 12 and the two holding bodies 30, 40 in accordance with FIG. 9, after introduction of the liquid between the two holding bodies 30, 40, wherein the liquid 14 in the form of the coating 21 adheres to the side walls 20 of the conversion body 12. The first side 16 and the second side 18 of the conversion body 12 remain free of liquid. The coating 21 is shown relatively thick to enable better illustration. However, the coating 21 can also be made significantly thinner. Afterward, the conversion body 12 with the coating 21 can be fired, as a result of which the conversion element 10 is formed. For firing purposes, the conversion body 12 can be removed from the holding bodies 30, 40. As an alternative thereto, the conversion body 12 can be fired in a manner held by the holding bodies 30, 40. Furthermore, two or more conversion bodies 12 can simultaneously be arranged between the two holding bodies 30, 40 and be held by the latter. When the liquid is introduced, all the conversion bodies 12 can then be coated simultaneously and/or afterward all the conversion elements 10 can be fired simultaneously.

Figure 11:
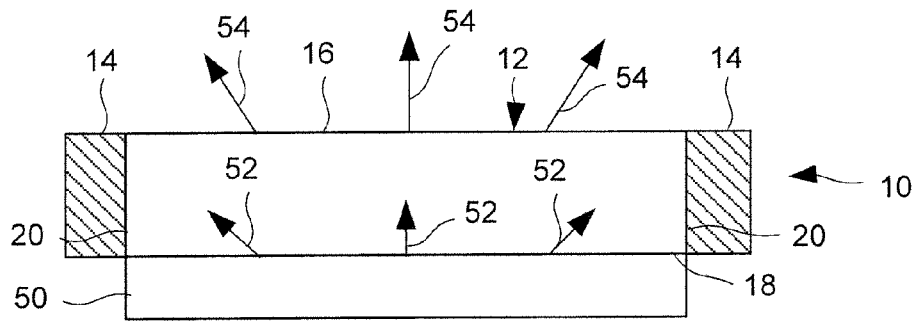
FIG. 11 shows an electromagnetic radiation emitting assembly.

FIG. 11 shows one example of an electromagnetic radiation emitting assembly comprising the conversion element 10 and an electromagnetic radiation emitting component 50. The electromagnetic radiation emitting component 50 is coupled in direct physical contact with the conversion body 12. As an alternative thereto, the electromagnetic radiation emitting component 50 can be arranged in a manner spaced apart from the conversion body 12 at a predefined positive distance of greater than zero. By way of example, silicone, an organic transparent or translucent body, a gel, a liquid, an immersion medium and/or air can be arranged between the conversion body 12 and the electromagnetic radiation emitting component 50.

The electromagnetic radiation emitting component 50 emits electromagnetic radiation, for example, excitation radiation 52. The excitation radiation 52 excites the phosphors in the conversion body 12 to emit converted electromagnetic radiation 54. The conversion element 10 can completely convert the excitation radiation 52 into converted electromagnetic radiation 54. As an alternative thereto, the conversion element 12 can be such that it transmits a portion of non-converted excitation radiation 52 such that the converted electromagnetic radiation 54 and the excitation radiation 52 mix. This can be used for targeted color mixing and thus to generate light having a desired color. By way of example, the excitation radiation 52 can comprise blue light and the converted electromagnetic radiation 54 can comprise yellow light. Depending on the color mixing, white or yellow light can then be provided by the electromagnetic radiation emitting assembly.

The excitation radiation 52 and/or the converted electromagnetic radiation 54 can be at least partly reflected at the reflective layer 14 before leaving the conversion element 10 in a direction away from the electromagnetic radiation emitting component 50. If the excitation radiation 52 is reflected back into the conversion body 12 by the reflective layer 14, then it can be converted there. Consequently, the reflective layer 14 can contribute to the conversion element 10 having a high conversion rate and thus a high efficiency. Furthermore, the reflective layer 14 can contribute to as much electromagnetic radiation as possible being emitted in a main emission direction.

Figure 12:
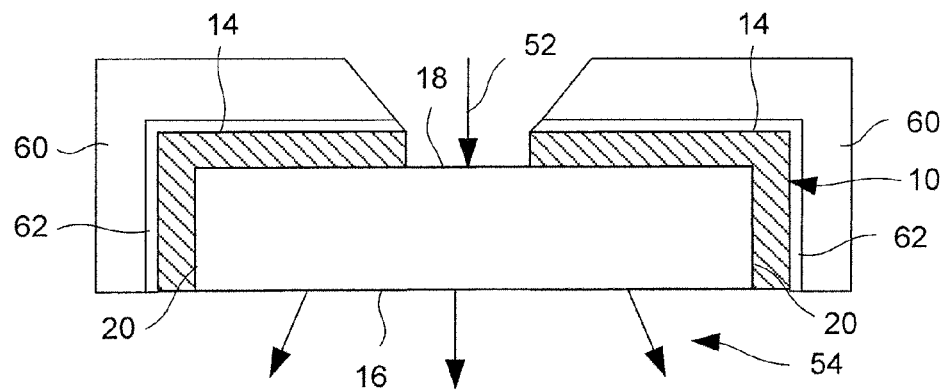
FIG. 12 shows one example of a conversion body and of a housing.

FIG. 12 shows one example of a conversion element 10, which can largely correspond to one of the conversion elements 10 explained above. The conversion element 10 comprises the reflective layer 14 at the side walls 20 of the conversion body 12 and partly also at the second side 18 of the conversion body 12. In particular, a cutout is formed in the reflective layer 14 on the second side 18 of the conversion body 12, through which cutout the electromagnetic radiation 52 to be converted can be coupled into the conversion body 12. A coupling layer 62 is formed on the reflective layer 14. The coupling layer 62 can completely or partly cover the reflective layer 14. The coupling layer 62 serves for thermally and/or mechanically coupling the conversion element 10 to a carrier body, for example, to a holding body 60. The holding body 60 can serve, for example, as a heat sink and/or as a mount for the conversion element 10. The coupling layer 62 comprises metal. By way of example, the coupling layer 62 is formed by a metal layer and/or by a solder layer.

Figure 13:
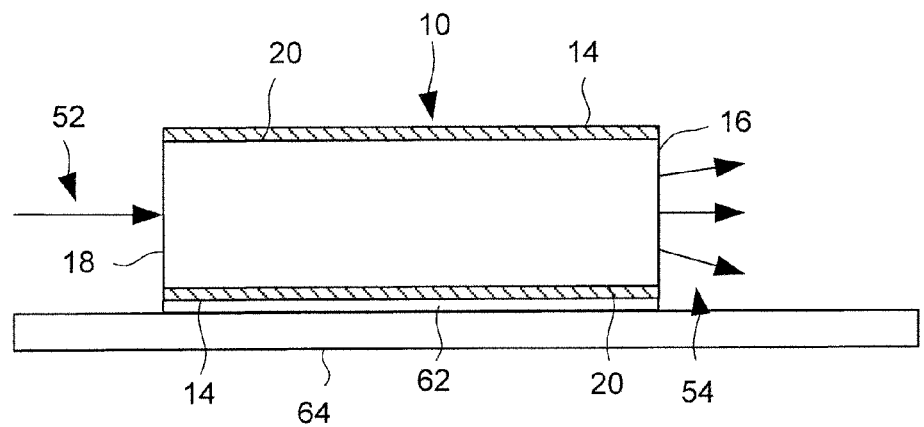
FIG. 13 shows one example of a conversion body and a printed circuit board.

FIG. 13 shows one example of a conversion element 10, which can largely correspond to one of the conversion elements 10 explained above. The conversion element 10 comprises the reflective layer 14 at the side walls 20 of the conversion body 12. The coupling layer 62 is formed on one of the side walls 20 with the reflective layer 14. The coupling layer 62 can completely or partly cover the corresponding reflective layer 14. The coupling layer 62 thermally and/or mechanically couples the conversion element 10 to a carrier body, for example, to a printed circuit board 64. The printed circuit board 64 can serve, for example, as a heat sink and/or as a mount for the conversion element 10. Furthermore, the electromagnetic radiation emitting component 50 can be arranged on the printed circuit board 64. If appropriate, the electromagnetic radiation emitting component 50 can be electrically contacted via the printed circuit board 64. The coupling layer 62 comprises metal. By way of example, the coupling layer 62 is formed by a metal layer and/or by a solder layer.

Figure 14:
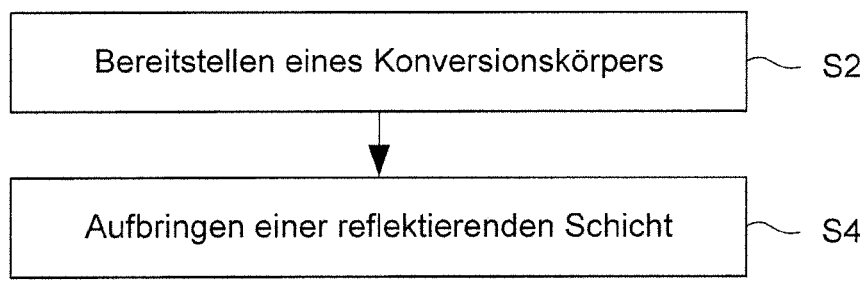
FIG. 14 shows a flow diagram of one example of a method of producing a conversion element.

FIG. 14 shows a flow diagram of one example of a method of producing a conversion element, for example, the conversion element 10 explained above.

A step S2 involves providing a conversion body, for example, the conversion body 12 explained above. The fact that the conversion body 12 is provided can mean, for example, that the conversion body 12 is formed. The conversion body 12 can be provided, for example, as a finished ceramic, glass and/or crystal body. As an alternative thereto, the conversion body 12 can be provided, for example, as a ceramic green body. The conversion body 12 comprises phosphor embedded into the conversion body 12.

A step S4 involves applying a reflective layer 14, comprising an inorganic material, to the conversion body 12, for example, the reflective layer 14 explained above, for example, comprising the inorganic material explained above. By way of example, the inorganic material is applied to the conversion body 12 by the liquid in the form of the coating 21. As an alternative thereto, the inorganic material can be applied to the conversion body 12 in powder form. The liquid, in particular the inorganic material, can be applied, for example, by being poured, sprayed or spread on the conversion body 12 or the latter being dipped into the liquid. The inorganic material is applied such that the coating 21 is formed at least at the side walls 20 of the conversion element 12, the coating subsequently serving as a basis for the reflective layer 14. The reflective layer 14 adhesively connects to the conversion body 12.

Figure 15:
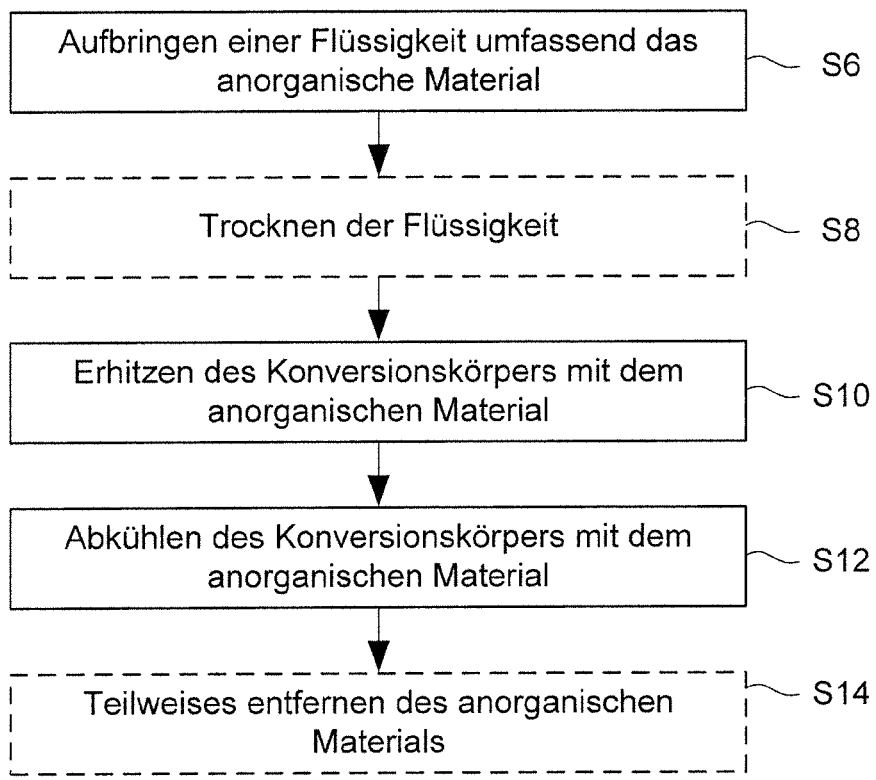
FIG. 15 shows a flow diagram of one example of a method of applying a reflective layer to a conversion body.

FIG. 15 shows a flow diagram of one example of a method of applying the reflective layer 14 to the conversion body 12 which can be processed, for example, in the course of step S4 of the above-explained method of producing the conversion element 10.

A step S6 involves applying a liquid, for example, the liquid explained above comprising the inorganic material, to the conversion body 12, for example, in the form of the coating 21. By way of example, for this purpose, the conversion body 12 can be completely or partly dipped into a bath of the liquid, which can also be referred to as dip coating. In addition, before being dipped into the bath of the liquid, the conversion body 12 can be coated with the masking material 26 at locations which are not intended to be provided with the reflective layer 14. Alternatively or additionally, the liquid can be applied to the conversion body 12, for example, by a brush. As an alternative thereto, in accordance with FIGS. 9 and 10, the conversion body 12 can be clamped in between the holding bodies 30, 40 and the liquid can be applied between the holding bodies 30, 40 and to the exposed side walls 20.

An optional step S8 can involve drying the liquid, for example, at a moderate temperature, for example, of 50° to 150°, for example, 80° to 120° degrees, for example, at approximately 100 degrees. If the inorganic material is an enamel frit, then an enamel biscuit can form on the conversion body 12 during the drying of the liquid.

A step S10 involves heating the conversion body 12 with the coating 21, for example, to a temperature of 350° to 1200°, for example, 700° to 1000°, for example, 800° to 950°. The adhesive connection between the inorganic material and the conversion body 12 and thus the reflective layer 14 forms during heating. By way of example, the inorganic material is baked with the conversion body 12 such that the reflective layer 14 forms.

A step S12 involves cooling the conversion body 12 with the reflective layer 14 comprising the inorganic material. The cooling can be carried out, for example, actively in a cooling chamber or only passively in a normal room at room temperature. Alternatively or additionally, the cooling can be carried out in a heated room at a temperature above room temperature so that the cooling takes place slowly.

In an optional step S14, the reflective layer 14 can be at least partly removed, for example, if the reflective layer 14 is applied on the entire conversion body 12 in accordance with FIGS. 4 and 5. The first side 16 and/or the second side 18 can be completely or at least partly exposed in step S14.

Optionally, the coupling layer 62 can be formed on the reflective layer 14. Furthermore, the conversion element 10 can be fixed to the housing 60 or the printed circuit board 64 by the coupling layer 62.

Our methods and elements are not restricted to the examples shown. By way of example, the conversion body 12 can be shaped differently in all the examples. Furthermore, more or fewer sides of the conversion body 12 can have the reflective layer 14 in all the examples. Furthermore, the methods shown can comprise additional or fewer steps.

The invention claimed is:

1. A method of producing a conversion element comprising:
    providing a conversion body for converting electromagnetic radiation with regard to the wavelength thereof;
    applying an inorganic material to at least one portion of the conversion body by a liquid that comprises the inorganic material being applied to at least the portion of the conversion body;
    heating the conversion body with the liquid adhering to it such that the inorganic material melts and enters into an adhesive connection with the conversion body; and
    cooling the conversion body with the inorganic material, wherein the inorganic material hardens during cooling and forms a reflective layer that reflects the electromagnetic radiation and/or converted electromagnetic radiation.

2. The method as claimed in claim 1, wherein the liquid is dried after being applied to the conversion body and before heating.

3. The method as claimed in claim 1, wherein the conversion body has a first side and a second side facing away from the first side, the conversion body has between the first side and the second side side walls that connect the first side and the second side, and the reflective layer is formed on at least one of the side walls.

4. The method as claimed in claim 3, wherein the conversion body is clamped in between a first holding body and a second holding body such that the first side of the conversion body is in physical contact with the first holding body and the second side of the conversion body is in physical contact with the second holding body, and, for the purpose of applying the inorganic material to the side walls of the conversion body, the liquid is introduced between the two holding bodies.

5. The method as claimed in claim 1, wherein the inorganic material is applied to the entire conversion body, and the reflective layer is at least partly removed from the conversion body after the adhesive connection of the inorganic material of the reflective layer to the conversion body.

6. The method as claimed in claim 5, wherein the inorganic material is at least partly removed from the first side of the conversion body and at least partly from the second side of the conversion body.

7. The method as claimed in claim 3, wherein, before the process of applying the inorganic material, the first side and the second side of the conversion body are at least partly coated by a masking material.

8. The method as claimed in claim 7, wherein the inorganic material is applied to the conversion body and the masking material, and the masking material and the inorganic material applied thereto are removed during the process of heating the conversion body.

9. The method as claimed in claim 7, wherein, during the process of applying the inorganic material, the masking material remains free of inorganic material, and the masking material is removed during the process of heating the conversion body.

10. The method as claimed in claim 1, wherein a coupling layer comprising metal is formed on the reflective layer.

11. A conversion element comprising:
  a conversion body that converts electromagnetic radiation with regard to the wavelength thereof; and
  a reflective layer applied to at least one portion of the conversion body adhesively connects to the conversion body and comprises a metal-free inorganic material.

12. A conversion element comprising:
  a conversion body that converts electromagnetic radiate on with regard to the wavelength thereof; and
  a reflective layer applied to at least one portion of the conversion body adhesively connects to the conversion body and comprises an inorganic material, wherein the conversion body has a first side and a second side facing away from the first side, the conversion body has between the first side and the second side side walls that connect the first side and the second side, and the inorganic material is applied to at least one portion of the side walls.

13. The conversion element as claimed in claim 12, wherein the side walls are covered with the inorganic material.

14. A conversion element comprising:
  a conversion body that converts electromagnetic radiation with regard to the wavelength thereof;
  a reflective layer applied to at least one portion of the conversion body adhesively connects to the conversion body and comprises an inorganic material, and
  a coupling layer comprising metal formed on the reflective layer.

* * * * *